(12) United States Patent
Konaka

(10) Patent No.: US 12,155,375 B2
(45) Date of Patent: Nov. 26, 2024

(54) ACOUSTIC WAVE ELEMENT, ACOUSTIC WAVE FILTER DEVICE, AND MULTIPLEXER

(71) Applicant: Murata Manufacturing Co., Ltd., Nagaokakyo (JP)

(72) Inventor: Yohei Konaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 285 days.

(21) Appl. No.: 17/899,667

(22) Filed: Aug. 31, 2022

(65) Prior Publication Data
US 2023/0275570 A1    Aug. 31, 2023

(30) Foreign Application Priority Data

Sep. 17, 2021   (JP) ................. 2021-152408

(51) Int. Cl.
*H03H 9/64*   (2006.01)
*H03H 9/145*  (2006.01)
*H03H 9/72*   (2006.01)

(52) U.S. Cl.
CPC .......... *H03H 9/6483* (2013.01); *H03H 9/145* (2013.01); *H03H 9/725* (2013.01)

(58) Field of Classification Search
CPC ...... H03H 9/6483; H03H 9/145; H03H 9/725; H03H 9/02637; H03H 9/02826; H03H 9/6496; H03H 9/02; H03H 9/14541
See application file for complete search history.

(56) References Cited

U.S. PATENT DOCUMENTS 6,498,548 B2 *  12/2002  Kaneda ............... H03H 9/6433
                                                   333/195
10,389,391 B2 *  8/2019  Ito ..................... H03H 9/02685
(Continued)

FOREIGN PATENT DOCUMENTS

WO     2018/168836 A1    9/2018

*Primary Examiner* — Andrea Lindgren Baltzell
*Assistant Examiner* — Kimberly E Glenn
(74) *Attorney, Agent, or Firm* — Keating & Bennett, LLP

(57) ABSTRACT

An acoustic wave element includes an electrode-finger pitch of reflecting-electrode fingers greater than an electrode-finger pitch pi of comb-shaped electrode fingers, and a center-to-center distance between a reflecting-electrode finger and a comb-shaped electrode finger is equal to or less than about 0.9 times the electrode-finger pitch of the reflecting-electrode fingers. When a reflecting-electrode finger counted from a closest reflecting-electrode finger is designated as a k-th reflecting-electrode finger in order, a reflecting-electrode finger farthest from the IDT electrode is defined as an (n+1)-th reflecting-electrode finger, and an electrode-finger pitch between the k-th reflecting-electrode finger and a (k+1)-th reflecting-electrode finger is defined as a k-th electrode-finger pitch $p_k$, a value of electrode-finger pitches from a first electrode-finger pitch $p_1$ to the k-th electrode-finger pitch $p_k$ is less than a value of electrode-finger pitches from a (k+1)-th electrode-finger pitch $p_{k+1}$ to an n-th electrode-finger pitch $p_n$.

12 Claims, 10 Drawing Sheets

(56) References Cited

U.S. PATENT DOCUMENTS

| | | | |
|---|---|---|---|
| 11,431,319 B2* | 8/2022 | Goto | H03H 9/02842 |
| 2016/0056791 A1* | 2/2016 | Shimizu | H03H 9/14582 |
| | | | 333/195 |
| 2020/0007110 A1 | 1/2020 | Konaka et al. | |

\* cited by examiner

FIG. 2
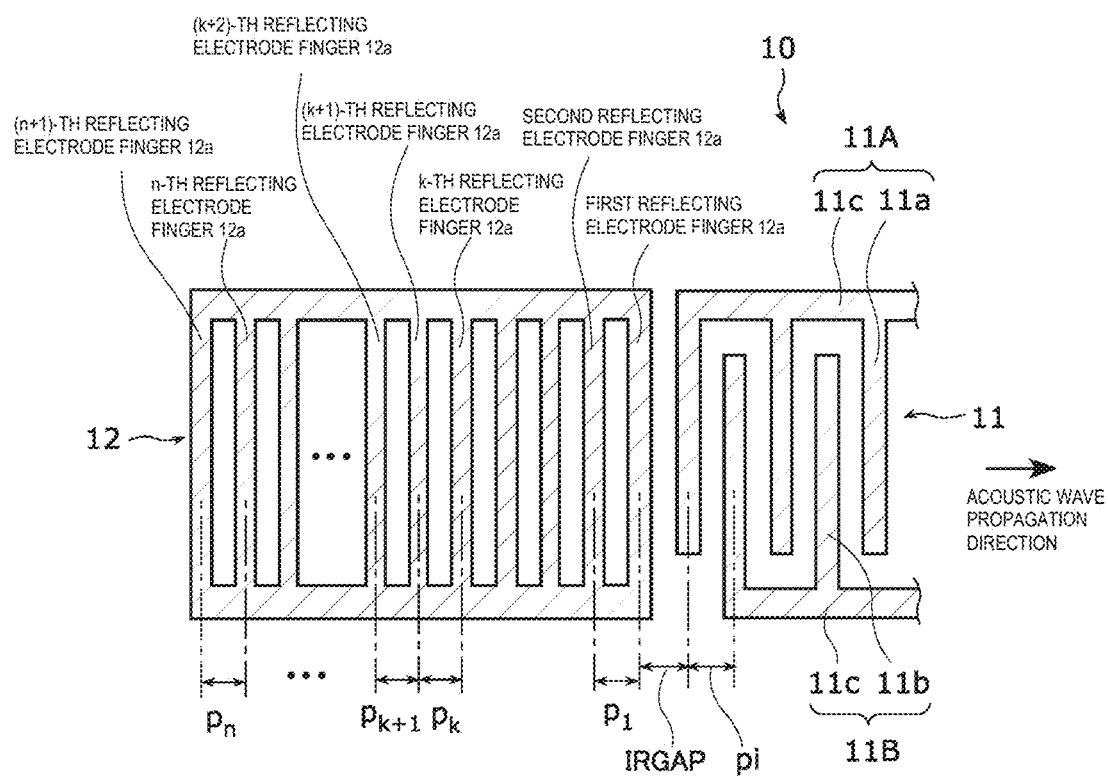
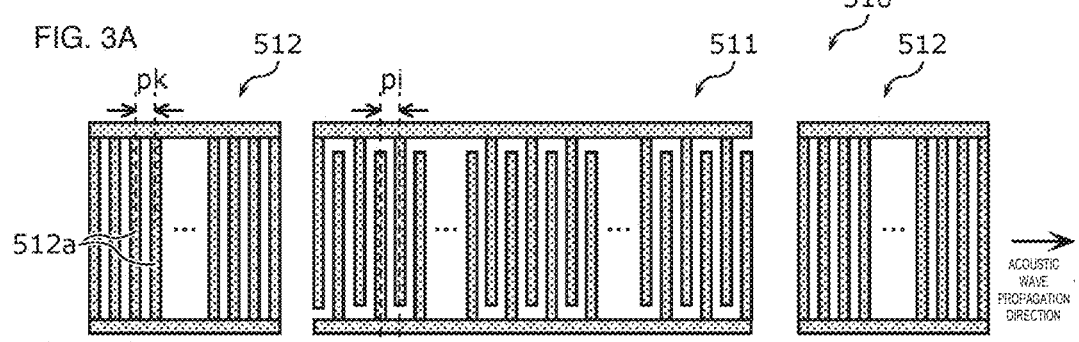
FIG. 3A
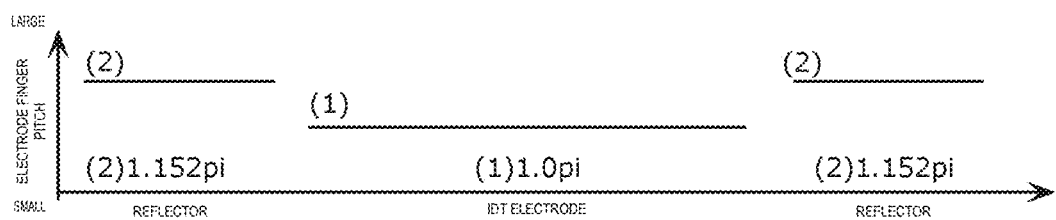
FIG. 3B

FIG. 6A
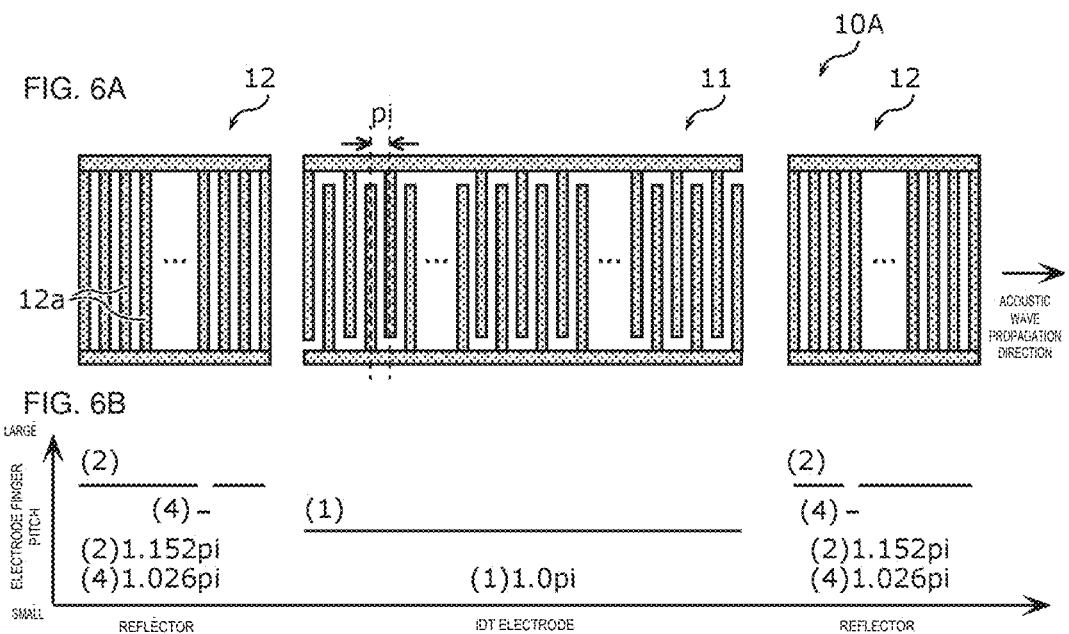
FIG. 6B
FIG. 7
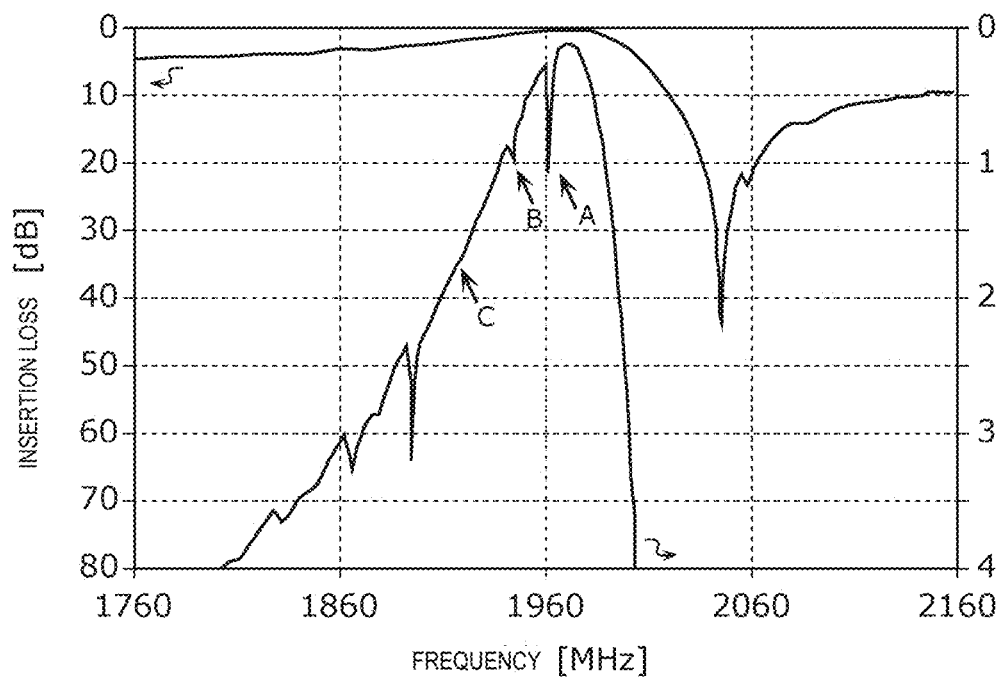

FIG. 8
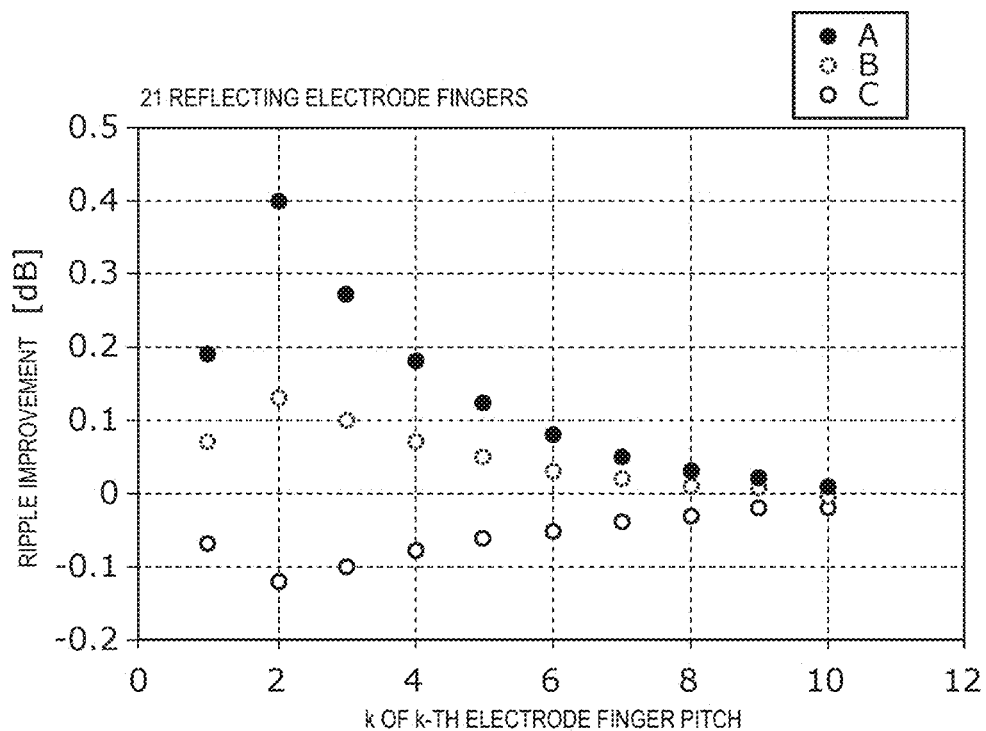
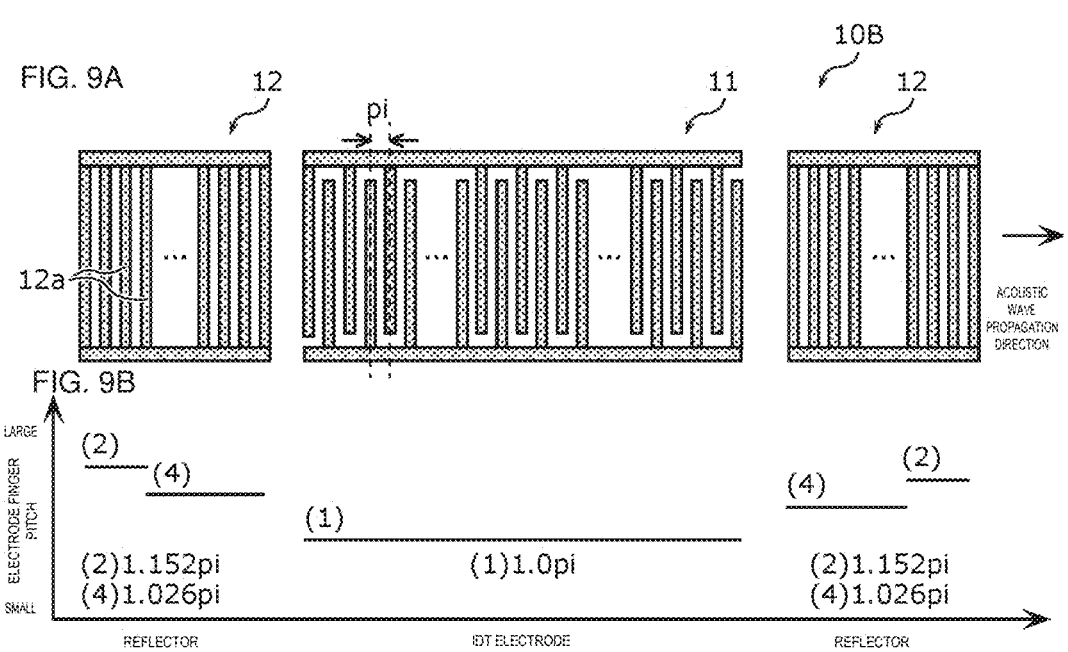

ACOUSTIC WAVE ELEMENT, ACOUSTIC WAVE FILTER DEVICE, AND MULTIPLEXER

CROSS REFERENCE TO RELATED APPLICATIONS

This application claims the benefit of priority to Japanese Patent Application No. 2021-152408, filed on Sep. 17, 2021. The entire contents of this application are hereby incorporated herein by reference.

BACKGROUND OF THE INVENTION

1. Field of the Invention

The present invention relates to an acoustic wave element, an acoustic wave filter device, and a multiplexer.

2. Description of the Related Art

In recent years, a multi-band system has been used to improve a data transmission rate of a mobile phone. In this case, since transmission and reception in a plurality of frequency bands are performed in some cases, a plurality of filter devices for causing high-frequency signals in different frequency bands to pass is arranged in a front-end circuit of the mobile phone. In this case, since a mounting space allowed for the above-described front-end circuit is limited, miniaturization, high isolation from an adjacent band, and a low loss property of a pass band are required for the above-described plurality of filter devices.

International Publication No. 2018/168836 discloses a configuration of a surface acoustic wave device that improves transmission characteristics. More specifically, the above-described surface acoustic wave device has a circuit configuration including a plurality of surface acoustic wave resonators having an IDT electrode and a reflector. In the above-described circuit configuration, a center-to-center distance between an electrode finger of the reflector closest to the IDT electrode and an electrode finger of the IDT electrode closest to the reflector in an acoustic wave propagation direction is equal to or less than 0.45 times a wavelength defined by an electrode-finger pitch of a reflector electrode. With this configuration, an increase in return loss on a frequency side lower than a resonant frequency of an acoustic wave resonator is suppressed or minimized.

In the surface acoustic wave resonator disclosed in International Publication No. 2018/168836, it is possible to suppress an increase in return loss on the frequency side lower than the resonant frequency of the acoustic wave resonator, but it is not possible to suppress a return loss in a partial band on the lower frequency side, and a ripple may appear.

SUMMARY OF THE INVENTION

Preferred embodiments of the present invention provide acoustic wave elements, acoustic wave filter devices, and multiplexers in each of which a ripple that occurs on a frequency side lower than a resonant frequency of the acoustic wave element can be reduced or prevented.

An acoustic wave element according to a preferred embodiment of the present invention includes a piezoelectric substrate, an IDT electrode provided on the piezoelectric substrate and including comb-shaped electrodes, and a reflector located adjacent to the IDT electrode in an acoustic wave propagation direction. The comb-shaped electrodes include a plurality of comb-shaped electrode fingers extending in a direction intersecting the acoustic wave propagation direction. The reflector includes a plurality of reflecting-electrode fingers extending in a direction intersecting the acoustic wave propagation direction. When, in the plurality of electrode fingers included in the IDT electrode and the reflector, a center-to-center distance between the electrode fingers adjacent to each other in the acoustic wave propagation direction is defined as an electrode-finger pitch, an electrode-finger pitch of the plurality of reflecting-electrode fingers is greater than an electrode-finger pitch of the plurality of comb-shaped electrode fingers, and a center-to-center distance in the acoustic wave propagation direction between a reflecting-electrode finger closest to the IDT electrode of the plurality of reflecting-electrode fingers and a comb-shaped electrode finger closest to the reflector of the plurality of comb-shaped electrode fingers is equal to or less than about 0.9 times the electrode-finger pitch of the plurality of reflecting-electrode fingers. When a reflecting-electrode finger counted from the reflecting-electrode finger closest to the IDT electrode in a direction away from the IDT electrode is designated as a k-th reflecting-electrode finger (where k is an integer equal to or greater than 1) in order, the reflecting-electrode finger farthest from the IDT electrode is defined as an (n+1)-th reflecting-electrode finger (where n is an integer greater than k), and an electrode-finger pitch between the k-th reflecting-electrode finger and a (k+1)-th reflecting-electrode finger is defined as a k-th electrode-finger pitch, a value of electrode-finger pitches from a first electrode-finger pitch to the k-th electrode-finger pitch is less than a value of electrode-finger pitches from the (k+1)-th electrode-finger pitch to an n-th electrode-finger pitch.

An acoustic wave filter device according to a preferred embodiment of the present invention includes the an acoustic wave element according to a preferred embodiment of the present invention.

A multiplexer according to a preferred embodiment of the present invention includes a plurality of filters including an acoustic wave filter device according to a preferred embodiment of the present invention. One of an input terminal and an output terminal of each of the filters is directly or indirectly connected to a common terminal, and at least one of the filters excluding the acoustic wave filter device has a pass band higher than a frequency in a pass band of the acoustic wave filter device.

With acoustic wave elements, acoustic wave filter devices, and multiplexers according to preferred embodiments of the present invention, it is possible to reduce or prevent a ripple that occurs on a frequency side lower than a resonant frequency of the acoustic wave element.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is a diagram illustrating electrode fingers of each of an IDT electrode and a reflector of the acoustic wave element according to Preferred Embodiment 1 of the present invention.

FIG. 3A and FIG. 3B are diagrams illustrating an IDT electrode and reflectors of an acoustic wave element of Comparative Example 1.

FIG. 6A and FIG. 6B are diagrams illustrating an IDT electrode and reflectors of an acoustic wave element of Example 2 of a preferred embodiment of the present invention.

FIG. 7 is a diagram showing an example of insertion loss of an existing acoustic wave element.

FIG. 8 is a graph showing amounts of improvement of ripples when an electrode-finger pitch of the reflector is changed in Example 2.

FIG. 9A and FIG. 9B are diagrams illustrating an IDT electrode and reflectors of an acoustic wave element of Example 3 of a preferred embodiment of the present invention.

DETAILED DESCRIPTION OF THE PREFERRED EMBODIMENTS

Hereinafter, preferred embodiments of the present invention will be described in detail with reference to the figures. All examples described below are general or specific examples. Numerical values, shapes, materials, constituent elements, arrangements and connection configurations of the elements, and the like illustrated in the following examples are merely examples, and are not intended to limit the present invention. Among the elements in the following examples, elements not recited in independent claims are described as optional elements. In addition, sizes or ratios of sizes of elements illustrated in the figures are not necessarily strict.

Preferred Embodiment 1

Configuration of Acoustic Wave Element

A configuration of an acoustic wave element 10 according to the present preferred embodiment will be described.

Figure 1:
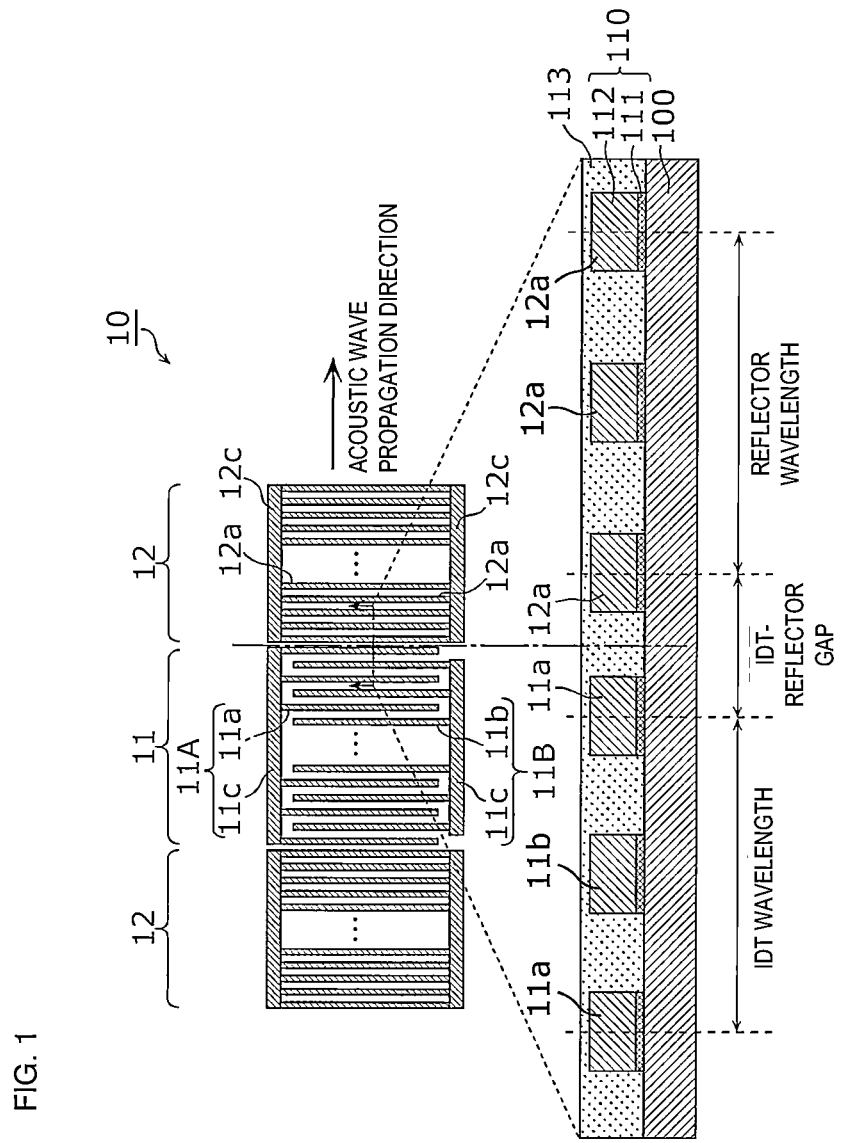
FIG. 1 includes a plan view and a sectional view schematically illustrating an electrode configuration of an acoustic wave element according to a preferred embodiment of the present invention.

FIG. 1 includes a plan view and a sectional view schematically illustrating an electrode configuration of the acoustic wave element 10. The acoustic wave element 10 illustrated in FIG. 1 includes a piezoelectric substrate 100, electrodes 110, and a protective film 113, and includes an interdigital transducer (IDT) electrode 11 and reflectors 12 defined by of these elements. The acoustic wave element 10 is preferably, for example, a surface acoustic wave (SAW) resonator defined by the IDT electrode 11, the reflectors 12, and the piezoelectric substrate 100.

The acoustic wave element 10 in FIG. 1 is illustrated to explain a typical structure thereof, and the number and length of electrode fingers of the electrodes are not limited thereto.

As illustrated in the sectional view in FIG. 1, the electrodes 110 defining the IDT electrode 11 and the reflectors 12 each include a multilayer structure of an adhesion layer 111 and a main electrode layer 112.

The adhesion layer 111 is a layer which improves adhesion between the piezoelectric substrate 100 and the main electrode layer 112, and as a material thereof, for example, Ti preferably is used.

As a material of the main electrode layer 112, for example, Al including 1% of Cu is preferably used.

The protective film 113 covers the electrodes 110. The protective film 113 protects the main electrode layer 112 from an external environment, adjusts frequency-temperature characteristics, improves moisture resistance, and the like, and is, for example, a film including silicon dioxide ($SiO_2$) as a main component.

The materials of the adhesion layer 111, the main electrode layer 112, and the protective film 113 are not limited to the materials described above. Further, the electrodes 110 need not have a multilayer structure. The electrodes 110 may be made of, for example, a metal such as Ti, Al, Cu, Pt, Au, Ag, or Pd, or an alloy thereof, or may include a stack of layers made from the above-described metals or alloys. Further, the protective film 113 need not be provided if it is not desired.

The piezoelectric substrate 100 is preferably made of, for example, a θ° Y-cut X-propagation $LiNbO_3$ piezoelectric single crystal or a piezoelectric ceramic (a lithium niobate single crystal or a ceramic that is cut along a plane with an axis, as a normal, rotated by θ° from a Y-axis to a Z-axis direction with an X-axis as a center axis, that is a single crystal or a ceramic in which a surface acoustic wave propagates in an X-axis direction).

The piezoelectric substrate 100 may be a substrate including a piezoelectric layer in at least a portion thereof, or may have a multilayer structure including a piezoelectric layer. The piezoelectric substrate 100 may include, for example, a high-acoustic-velocity support substrate, a low-acoustic-velocity film, and a piezoelectric layer, and may have a structure in which the high-acoustic-velocity support substrate, the low-acoustic-velocity film, and the piezoelectric layer are stacked in this order. Hereinafter, a configuration of the high-acoustic-velocity support substrate, the low-acoustic-velocity film, and the piezoelectric layer will be described.

The piezoelectric layer is preferably made of, for example, a θ° Y-cut X-propagation LiNbO$_3$ piezoelectric single crystal or a piezoelectric ceramic (a lithium niobate single crystal or a ceramic that is cut along a plane with an axis, as a normal, rotated by θ° from a Y-axis to a Z-axis direction with an X-axis as a center axis, and that is a single crystal or a ceramic in which a surface acoustic wave propagates in an X-axis direction).

The high-acoustic-velocity support substrate supports the low-acoustic-velocity film, the piezoelectric layer, and the electrodes 110. Additionally, the high-acoustic-velocity support substrate is a substrate in which acoustic velocity of a bulk wave in the high-acoustic-velocity support substrate is higher than that of an acoustic wave such as, for example, a surface acoustic wave or a boundary wave propagating through the piezoelectric layer, and functions to confine a surface acoustic wave in a portion where the piezoelectric layer and the low-acoustic-velocity film are stacked, and to prevent the surface acoustic wave from leaking to a downside of the high-acoustic-velocity support substrate. The high-acoustic-velocity support substrate is preferably, for example, a silicon substrate. The high-acoustic-velocity support substrate may be made from, for example, any one of: (1) a piezoelectric material such as aluminum nitride, aluminum oxide, silicon carbide, silicon nitride, silicon, sapphire, lithium tantalate, lithium niobate, or quartz, (2) various ceramics such as alumina, zirconia, cordierite, mullite, steatite, or forsterite, (3) magnesia diamond, (4) a material containing any of the above-described materials as a main component, and (5) a material including a mixture of any of the above-described materials as a main component.

The low-acoustic-velocity film is a film in which acoustic velocity of a bulk wave in the low-acoustic-velocity film is lower than acoustic velocity of an acoustic wave propagating through the piezoelectric layer, and is between the piezoelectric layer and the high-acoustic-velocity support substrate. With this structure and a property that energy of an acoustic wave is primarily concentrated in a medium in which acoustic velocity is low, leakage of surface acoustic wave energy to an outside of the IDT electrode is reduced or prevented. The low-acoustic-velocity film is, for example, a film including silicon dioxide (SiO$_2$) as a main component.

According to the above-described multilayer structure of the piezoelectric substrate 100, it is possible to significantly increase a Q value of an acoustic wave resonator at a resonant frequency and an anti-resonant frequency, compared to a structure in which the piezoelectric substrate 100 as a single layer is used. That is, since a surface acoustic wave resonator having a high Q value can be provided, a filter having a small insertion loss can be provided by using the surface acoustic wave resonator.

Note that the high-acoustic-velocity support substrate may have a structure in which a support substrate, and a high-acoustic-velocity film in which acoustic velocity of a bulk wave propagating therethrough is higher than that of an acoustic wave such as a surface acoustic wave or a boundary wave propagating through the piezoelectric layer, are stacked. In this case, for the support substrate, a piezoelectric material such as, for example, sapphire, lithium tantalate, lithium niobate, or quartz crystal, various ceramics such as alumina, magnesia, silicon nitride, aluminum nitride, silicon carbide, zirconia, cordierite, mullite, steatite, or forsterite, a dielectric such as glass, a semiconductor such as silicon or gallium nitride, a resin substrate, or the like can be used. Further, for the high-acoustic-velocity film, various high-acoustic-velocity materials such as, for example, aluminum nitride, aluminum oxide, silicon carbide, silicon nitride, silicon oxynitride, a DLC film or diamond, a medium including the above-described material as a main component, and a medium including a mixture of the above-described materials as a main component can be used.

The materials and the like of each layer illustrated in the above-described multilayer structure of the piezoelectric substrate 100 are merely examples, and, for example, may be changed according to which characteristics are important among required high-frequency propagation characteristics.

As illustrated in the plan view in FIG. 1, the IDT electrode 11 includes a pair of comb-shaped electrodes 11A and 11B facing each other. The comb-shaped electrode 11A is defined by a plurality of comb-shaped electrode fingers 11a arranged to extend in a direction intersecting an acoustic wave propagation direction, and a busbar electrode 11c that connects ends of the plurality of comb-shaped electrode fingers 11a to each other. The comb-shaped electrode 11B is defined by a plurality of comb-shaped electrode fingers 11b arranged to extend in the direction intersecting the acoustic wave propagation direction, and a busbar electrode 11c that connects ends of the plurality of comb-shaped electrode fingers 11b to each other. The comb-shaped electrode fingers 11a and the comb-shaped electrode fingers 11b are alternately arranged in the acoustic wave propagation direction.

The reflectors 12 are adjacent to the IDT electrode 11 in the acoustic wave propagation direction. The reflectors 12 are defined by a plurality of reflecting-electrode fingers 12a arranged so as to extend in the direction intersecting the above-described acoustic wave propagation direction, and busbar electrodes 12c that connect ends of the reflecting-electrode fingers 12a to each other. A plurality of reflectors 12 are provided, and one is located on each of two outer sides of the IDT electrode 11 in the acoustic wave propagation direction.

FIG. 2 is a diagram illustrating the IDT electrode 11 and the reflectors 12 of the acoustic wave element 10 according to the present preferred embodiment. FIG. 2 illustrates one of the two reflectors 12. The other reflector 12, not illustrated in FIG. 2, is mirror-symmetrical with the one reflector 12 in the acoustic wave propagation direction.

In the acoustic wave element 10 of the present preferred embodiment, an electrode-finger pitch of the plurality of reflecting-electrode fingers 12a included in the reflectors 12 is preferably greater than an electrode-finger pitch pi of the plurality of comb-shaped electrode fingers 11a and 11b included in the IDT electrode 11.

In the plurality of electrode fingers included in the IDT electrode 11 and the reflectors 12, the electrode-finger pitch is a center-to-center distance between the electrode fingers adjacent to each other in the acoustic wave propagation direction.

For example, when electrode-finger pitches of the plurality of comb-shaped electrode fingers 11a and 11b in the IDT electrode 11 are different from each other, the electrode-finger pitch pi of the comb-shaped electrode fingers 11a and 11b is represented by an average value of all of the plurality of electrode-finger pitches of the comb-shaped electrodes 11a and 11b. In other words, the electrode-finger pitch pi in the IDT electrode 11 is obtained, for example, by dividing a center-to-center distance between the comb-shaped electrode fingers 11a and 11b at both ends by (the total number of comb-shaped electrode fingers 11a and 11b–1).

For example, when the electrode-finger pitches of the plurality of reflecting-electrode fingers 12a in the reflectors 12 are different from each other, the electrode-finger pitch of the reflecting-electrode fingers 12a is represented by an average value of the electrode-finger pitches of the plurality of reflecting-electrode fingers 12a. Twice the electrode-finger pitch pi of the plurality of comb-shaped electrode fingers 11a and 11b corresponds to an IDT wavelength that is a wavelength of the IDT electrode 11. Twice the electrode-finger pitch of the plurality of reflecting-electrode fingers 12a corresponds to a reflector wavelength that is a wavelength of the reflectors 12 (see FIG. 1).

In addition, in the acoustic wave element 10 of the present preferred embodiment, an IDT-reflector gap (IRGAP) illustrated in FIG. 2 is, for example, equal to or less than about 0.9 times the electrode-finger pitch of the plurality of reflecting-electrode fingers 12a (equal to or less than about 0.45 times the reflector wavelength). The IDT-reflector gap is a distance between centers (center-to-center distance), in the acoustic wave propagation direction, of the comb-shaped electrode finger (11a in FIG. 2) closest to the reflector 12 of the plurality of comb-shaped fingers 11a and 11b and the reflecting-electrode finger 12a closest to the IDT electrode 11 of the plurality of reflecting-electrode fingers 12a.

Further, the acoustic wave element 10 of the present preferred embodiment has a characteristic configuration described below.

Here, the reflecting-electrode finger 12a counted from the reflecting-electrode finger 12a closest to the IDT electrode 11 in a direction away from the IDT electrode 11 is designated as a k-th reflecting-electrode finger in order (where k is an integer equal to or greater than 1). Further, the reflecting-electrode finger 12a farthest from the IDT electrode 11 is defined as an (n+1)-th reflecting-electrode finger (where n is an integer greater than k). Note that n+1 corresponds to the total number of reflecting-electrode fingers 12a. Further, an electrode-finger pitch between the k-th reflecting-electrode finger 12a and a (k+1)-th reflecting-electrode finger 12a is defined as a k-th electrode-finger pitch $p_k$.

Under the above-described definitions, the acoustic wave element 10 of the present preferred embodiment has a configuration in which a value of electrode-finger pitches from a first electrode-finger pitch $p_1$ to the k-th electrode-finger pitch $p_k$ is less than a value of electrode-finger pitches from a (k+1)-th electrode-finger pitch $p_{k+1}$ to an n-th electrode-finger pitch $p_n$. With this configuration, it is possible to reduce or prevent a ripple that occurs on a frequency side lower than a resonant frequency of the acoustic wave element 10.

Hereinafter, the above-described configuration and advantageous effects of the acoustic wave element 10 according to the present preferred embodiment will be described by comparing examples and comparative examples.

Example 1

Acoustic wave elements of Example 1 of a preferred embodiment of the present invention and Comparative Example 1 will be described with reference to FIG. 3A and FIG. 3B to FIG. 5. In a plurality of examples and comparative examples to be described below, an electrode-finger pitch of reflectors is greater than the electrode-finger pitch pi of an IDT electrode, and an IDT-reflector gap (IRGAP) is, for example, equal to or less than about 0.9 times the electrode-finger pitch of the reflectors.

FIG. 3A and FIG. 3B are diagrams illustrating an IDT electrode 511 and reflectors 512 of an acoustic wave element 510 of Comparative Example 1. FIG. 3A illustrates electrode fingers of each of the IDT electrode 511 and the reflectors 512, and FIG. 3B illustrates a value of an electrode-finger pitch of each of the IDT electrode 511 and the reflectors 512 as a graph.

As illustrated in FIG. 3A and FIG. 3B, in Comparative Example 1, an electrode-finger pitch of reflecting-electrode fingers 512a adjacent to each other is, for example, about 1.152 times the electrode-finger pitch pi of the IDT electrode 11. As described above, in Comparative Example 1, all electrode-finger pitches in the reflectors 512 have the same or substantially the same value. The total number of reflecting-electrode fingers 512a of the reflectors 512 is, for example, 21.

Figure 4A:
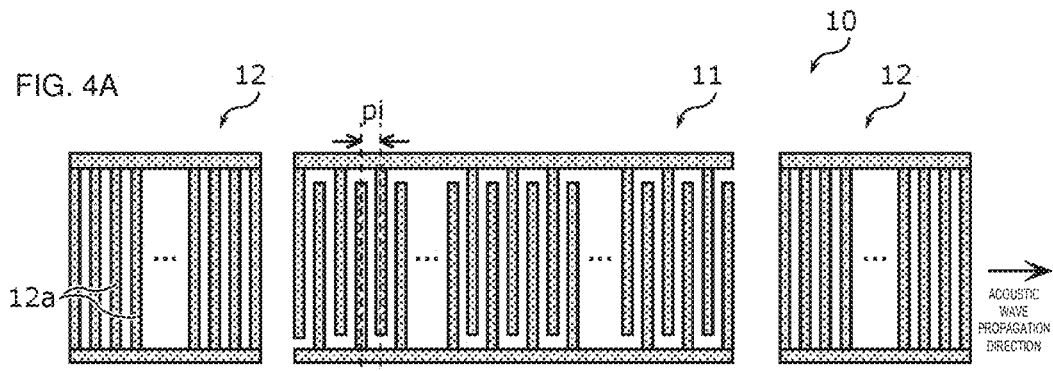
FIG. 4A and FIG. 4B are diagrams illustrating an IDT electrode and reflectors of an acoustic wave element of Example 1 of a preferred embodiment of the present invention.
Figure 4B:
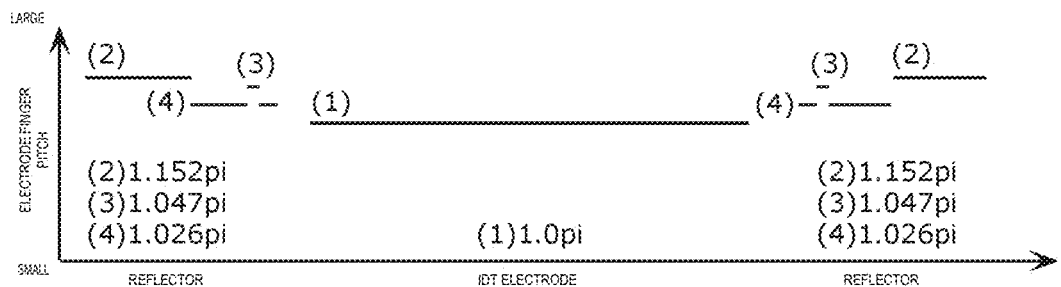

FIG. 4A and FIG. 4B are diagrams illustrating the IDT electrode 11 and the reflectors 12 of the acoustic wave element 10 of Example 1. FIG. 4A illustrates electrode fingers of each of the IDT electrode 11 and the reflectors 12, and FIG. 4B illustrates a value of an electrode-finger pitch of each of the IDT electrode 11 and the reflectors 12 as a graph.

In the reflectors 12 of Example 1, a second electrode-finger pitch $p_2$ is, for example, about 1.047 times the electrode-finger pitch pi of the IDT electrode 11. Additionally, each of first to ninth electrode-finger pitches $p_1$ and $p_3$ to $p_9$ excluding the second electrode-finger pitch $p_2$ is, for example, about 1.026 times the electrode-finger pitch pi of the IDT electrode 11. Further, each of tenth to 20th electrode-finger pitches $p_{10}$ to $p_{20}$ is, for example, about 1.152 times the electrode-finger pitch pi of the IDT electrode 11. Note that the total number of reflecting-electrode fingers 12a of the reflectors 12 is, for example, 21.

That is, in Example 1, under conditions of k=9 and n+1=21, a value of the electrode-finger pitches from the first electrode-finger pitch $p_1$ to a k-th electrode-finger pitch $p_k$ is less than a value of electrode-finger pitches from a (k+1)-th electrode-finger pitch $p_{k+1}$ to an n-th electrode-finger pitch $p_n$. In addition, in Example 1, a value of the second electrode-finger pitch $p_2$ is greater than the value of the electrode-finger pitches from the first electrode-finger pitch $p_1$ to the k-th electrode-finger pitch $p_k$ excluding the second electrode-finger pitch $p_2$, and is less than the value of the electrode-finger pitches from the (k+1)-th electrode-finger pitch $p_{k+1}$ to the n-th electrode-finger pitch $p_n$.

Figure 5:
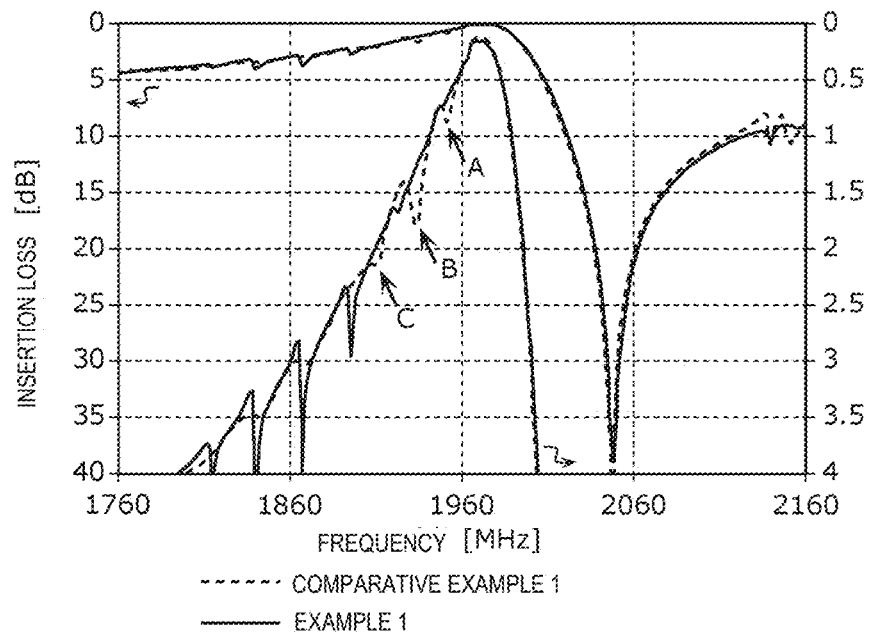
FIG. 5 is a graph showing insertion loss of the acoustic wave element of each of Example 1 and Comparative Example 1.

FIG. 5 is a graph showing insertion loss of the acoustic wave element of each of Example 1 and Comparative Example 1. FIG. 5 shows that the return loss increases on a lower side of a vertical axis.

As shown in FIG. 5, in Comparative Example 1, three ripples A, B, and C occur on a frequency side lower than a resonant frequency fr of the acoustic wave element. On the other hand, in Example 1, occurrence of each of the ripples A, B, and C is reduced or prevented. As described above, in the reflectors 12, by making the value of the electrode-finger pitches from the first electrode-finger pitch $p_1$ to the k-th electrode-finger pitch $p_k$ less than the value of the electrode-finger pitches from the (k+1)-th electrode-finger pitch $p_{k+1}$ to the n-th electrode-finger pitch $p_n$, it is possible to reduce or prevent the ripples A to C occurring on the frequency side lower than the resonant frequency fr of the acoustic wave elements 10.

Example 2

An acoustic wave element 10A of Example 2 of a preferred embodiment of the present invention will be described with reference to FIG. 6A and FIG. 6B to FIG. 8.

In Example 2, an example will be described in which a value of one electrode-finger pitch among a first electrode-finger pitch $p_1$ to a k-th electrode-finger pitch $p_k$ is changed.

FIG. 6A and FIG. 6B are diagrams illustrating the IDT electrode 11 and the reflectors 12 of the acoustic wave element 10A of Example 2. FIG. 6A illustrates electrode fingers of each of the IDT electrode 11 and the reflectors 12, and FIG. 6B illustrates a value of each of the electrode-finger pitches of the IDT electrode 11 and the reflectors 12 in a graph. The total number of reflecting-electrode fingers 12a of the reflectors 12 is, for example, 21.

In the reflectors 12 of Example 2, under conditions of k=9 and n+1=21, a k-th electrode-finger pitch $p_k$ is, for example, about 1.026 times the electrode-finger pitch pi of the IDT electrode 11, that is, about 0.98 times the second electrode-finger pitch $p_2$ (=1.047 pi) of Example 1. Further, other electrode-finger pitches $p_1$ to $p_{k-1}$ and $p_{k+1}$ to $p_n$ excluding the k-th electrode-finger pitch $p_k$ are, for example, about 1.152 times the electrode-finger pitch pi of the IDT electrode 11.

FIG. 7 is a graph showing an example of insertion loss of an existing acoustic wave element. The graph shows that the return loss increases on a lower side of a vertical axis.

FIG. 7 shows three ripples A, B, and C occurring on a frequency side lower than a resonant frequency fr of the acoustic wave element. It is considered effective to reduce or prevent the occurrence of the ripples A and B near the resonant frequency fr, among the ripples A, B, and C. Although the amount of the ripple C that occurs is small in the example in FIG. 7, it is preferable that the small ripple C does not become too large when the conditions of the electrode-finger pitches are changed.

FIG. 8 is a graph showing amounts of improvement of the ripples A, B, and C when the electrode-finger pitch of the reflectors 12 is changed in Example 2. The amounts of improvement of the ripples A, B, and C are amounts of improvement with respect to the ripples A, B, and C occurring in the existing acoustic wave resonator illustrated in FIG. 7. A positive direction of a vertical axis in FIG. 8 is a direction in which the ripples A to C decrease and losses decrease, and a negative direction is a direction in which the ripples A to C increase and the losses increase.

As shown in FIG. 8, the ripples A and B can be reduced or prevented by making one electrode-finger pitch among a first electrode-finger pitch $p_1$ to a ninth electrode-finger pitch $p_9$ less than the other electrode-finger pitches. To be more specific, the losses can be reduced or prevented by setting one electrode-finger pitch of the first electrode-finger pitch $p_1$ to the ninth electrode-finger pitch $p_9$ to, for example, about 1.026 times the electrode-finger pitch pi of the IDT electrode 11, and setting the other electrode-finger pitches to, for example, about 1.152 times the electrode-finger pitch pi of the IDT electrode 11. On the other hand, when a value of k of the k-th electrode-finger pitch is 10, the amounts of improvement of the ripples are decreased. Thus, it is sufficient to change the electrode-finger pitch up to the ninth electrode-finger pitch $p_9$.

Further, as shown in FIG. 8, when the second electrode-finger pitch $p_2$ is changed, the amounts of improvement of the ripples are largely changed. For example, by making the second electrode-finger pitch $p_2$ less than the other electrode-finger pitches, the ripples A and B can be reduced or prevented, but on the other hand, the loss of the ripple C increases. Thus, for the second electrode-finger pitch $p_2$, it is preferable to maintain the value of the second electrode-finger pitch $p_2$ (=1.047 pi) in Example 1 without changing it.

Example 3

An acoustic wave element 10B of Example 3 of a preferred embodiment of the present invention will be described with reference to FIG. 9A, FIG. 9B, and FIG. 10. In Example 3, an example will be described in which a plurality of electrode-finger pitches including an electrode-finger pitch of the reflecting-electrode finger 12a farthest from the IDT electrode 11 is changed.

FIG. 9A and FIG. 9B are diagrams illustrating the IDT electrode 11 and the reflectors 12 of the acoustic wave element 10B of Example 3. FIG. 9A illustrates electrode fingers of each of the IDT electrode 11 and the reflectors 12, and FIG. 9B shows a value of each of an electrode-finger pitch of each of the IDT electrode 11 and the reflectors 12 in a graph. Note that the total number of reflecting-electrode fingers 12a of the reflectors 12 is 21.

In the reflectors 12 of Example 3, under a condition of n+1=21, a value of all electrode-finger pitches from an n-th electrode-finger pitch $p_n$ to a k-th electrode-finger pitch $p_k$ is, for example, about 1.152 times the electrode-finger pitch pi of the IDT electrode 11, that is, about 1.1 times the second electrode-finger pitch $p_2$ (=1.047 pi) of Example 1. Further, a value of all electrode-finger pitches from a (k−1)-th electrode-finger pitch $p_{k-1}$ to a first electrode-finger pitch $p_1$, which are remaining electrode-finger pitches, is, for example, about 1.026 times the electrode-finger pitch pi of the IDT electrode 11. Note that the reason why the value of all the electrode-finger pitches from the n-th electrode-finger pitch $p_n$ to the k-th electrode-finger pitch $p_k$ was changed is that a large change did not appear in insertion loss when only a value of one electrode-finger pitch among the n-th electrode-finger pitch $p_n$ to the k-th electrode-finger pitch $p_k$ was changed.

Figure 10:
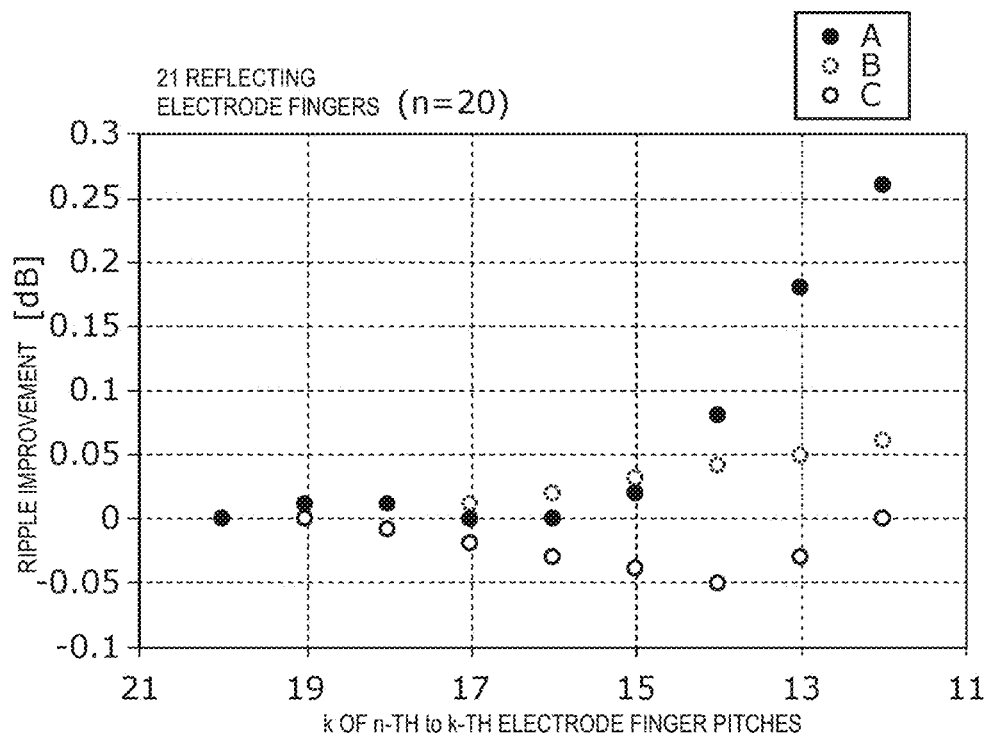
FIG. 10 is a graph showing amounts of improvement of ripples when an electrode-finger pitch of the reflector is changed in Example 3.

FIG. 10 is a graph showing amounts of improvement of ripples A, B, and C when an electrode-finger pitch of the reflectors 12 is changed in Example 3.

As shown in FIG. 10, even when a value of all electrode-finger pitches from the 20th electrode-finger pitch $p_{20}$ to the 17th electrode-finger pitch $p_{17}$ is changed, values of the ripples A, B, and C hardly change. To be more specific, even when the value of all the electrode-finger pitches from the 20th electrode-finger pitch $p_{20}$ to the 17th electrode-finger pitch $p_{17}$ is set to, for example, about 1.152 times the electrode-finger pitch pi of the IDT electrode 11, and a value of the other electrode-finger pitches is set to, for example, about 1.026 times the electrode-finger pitch pi of the IDT electrode 11, losses cannot be reduced. Thus, even when an electrode-finger pitch of a reflecting-electrode finger 12a located away from the IDT electrode 11 among the reflecting-electrode fingers 12a of the reflectors 12 is changed, the effect of reducing the losses is small.

Example 4

An acoustic wave element 10C of Example 4 of a preferred embodiment of the present invention will be described with reference to FIG. 11A, FIG. 11B, and FIG. 12. In Example 4, an example will be described in which a plurality of electrode-finger pitches including an electrode-finger pitch of the reflecting-electrode finger 12a closest to the IDT electrode 11 is changed.

Figure 11A:
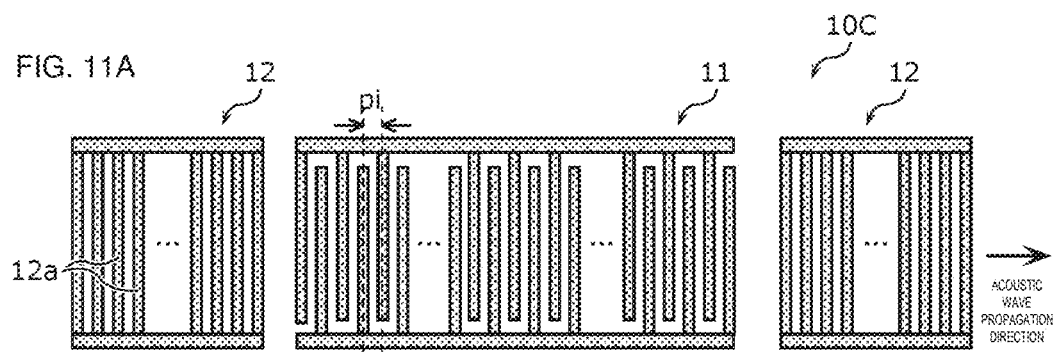
FIG. 11A and FIG. 11B are diagrams illustrating an IDT electrode and reflectors of an acoustic wave element of Example 4 of a preferred embodiment of the present invention.
Figure 11B:
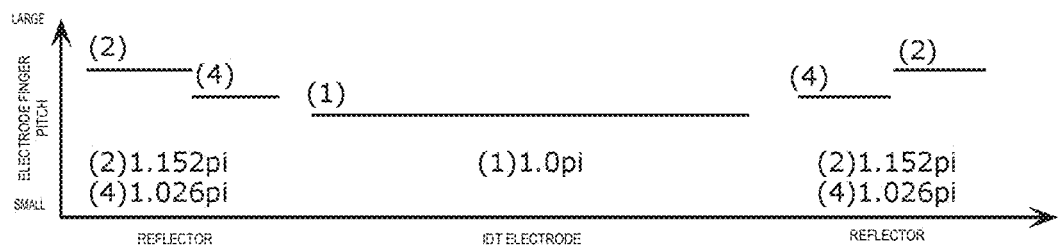

FIG. 11A and FIG. 11B are diagrams illustrating the IDT electrode 11 and the reflectors 12 of the acoustic wave element 10C of Example 4. FIG. 11A illustrates a plan view of the IDT electrode 11 and the reflectors 12, and FIG. 11B shows a value of an electrode-finger pitch of each of the IDT electrode 11 and the reflectors 12 as a graph. Note that the total number of reflecting-electrode fingers 12a of the reflectors 12 is, for example, 21.

In the reflectors 12 of Example 4, under a condition of n+1=21, a value of all the electrode-finger pitches from the first electrode-finger pitch $p_1$ to the k-th electrode-finger pitch $p_k$ is, for example, about 1.026 times the electrode-finger pitch pi of the IDT electrode 11. Further, a value of all the electrode-finger pitches from a (k+1)-th electrode-finger pitch $p_{(k+1)}$ to an n-th electrode-finger pitch $p_n$, which are in a range of remaining electrode-finger pitches, is, for example, about 1.152 times the electrode finger pitch pi of the IDT electrode 11. That is, Example 4 is different from Example 1 in that a value of a second electrode-finger pitch $p_2$ is also the same as the first to k-th electrode-finger pitches $p_1$ to $p_k$ excluding the second electrode-finger pitch $p_2$.

Figure 12:
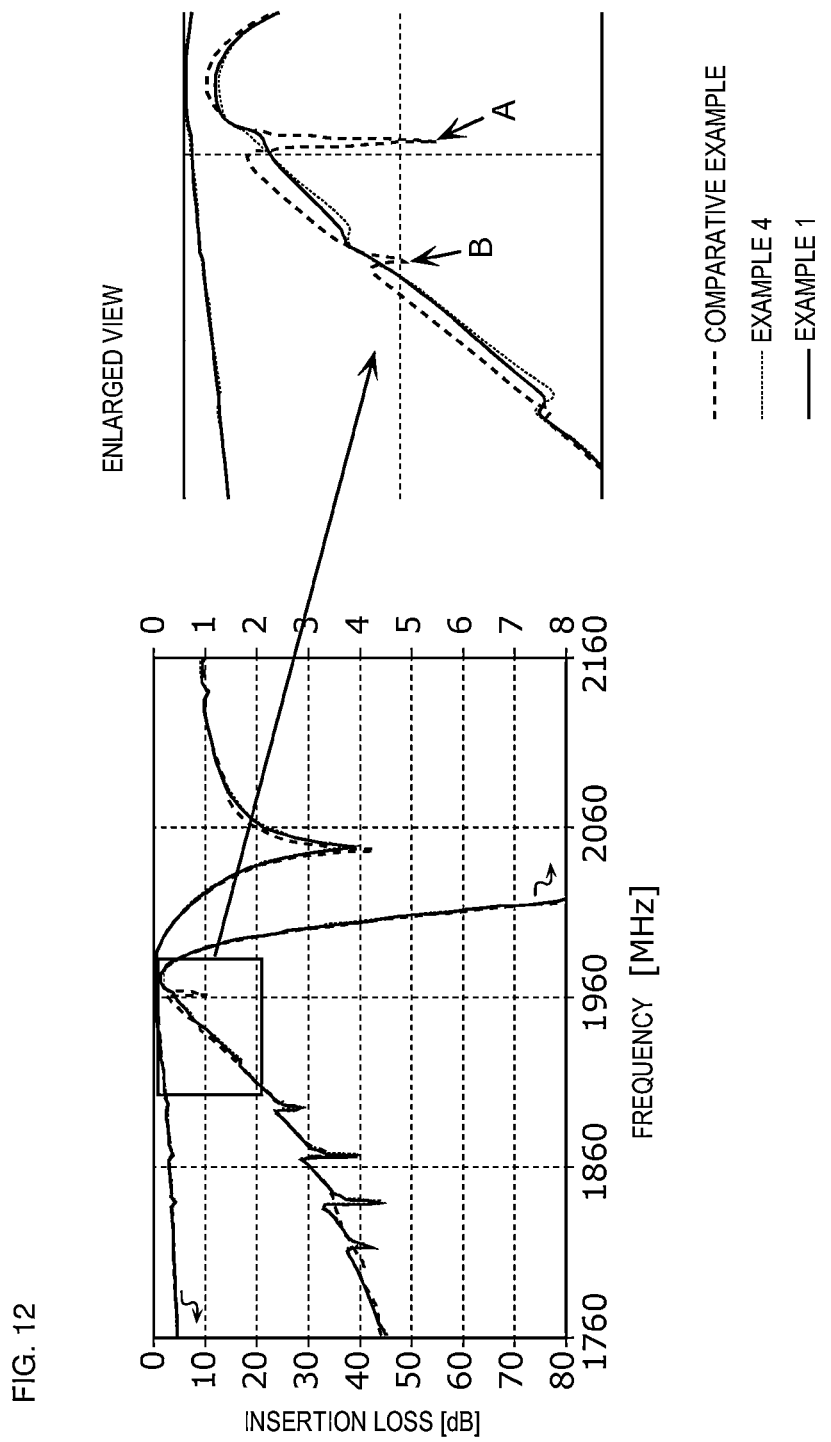
FIG. 12 includes graphs showing insertion loss of the acoustic wave element of each of Example 1 and Example 4, and insertion loss of an acoustic wave element of a comparative example.

FIG. 12 is a graph showing insertion loss of the acoustic wave element of each of Example 1 and Example 4, and insertion loss of an acoustic wave element of a comparative example.

As shown in FIG. 12, in Example 4, the magnitude of each of ripples A and B is smaller compared to the comparative example. As described above, in Example 4, it is possible to reduce or prevent the ripples A and B that occur on a frequency side lower than a resonant frequency of the acoustic wave element 10C.

In addition, in Example 1, an insertion loss between frequencies of about 1920 MHz and about 1960 MHz is smaller compared to Example 4. As in Example 1, by making the value of the second electrode-finger pitch $p_2$ greater than the value of electrode-finger pitches from the first to k-th electrode-finger pitches $p_1$ to $p_k$ excluding the second electrode-finger pitch $p_2$, and less than the value of the electrode-finger pitches from the (k+1)-th electrode-finger pitch $p_{k+1}$ to the n-th electrode-finger pitch $p_n$, it is possible to further reduce or prevent the ripples A and B occurring on the frequency side lower than the resonant frequency of the acoustic wave element 10.

Example 5

An acoustic wave element of Example 5 of a preferred embodiment of the present invention will be described. In Example 5, an example will be described in which a value of one electrode-finger pitch among the first electrode-finger pitch $p_1$ to the k-th electrode-finger pitch $p_k$ is changed in a case where the total number of reflecting-electrode fingers 12a of the reflectors 12 is, for example, about 11.

Figure 13:
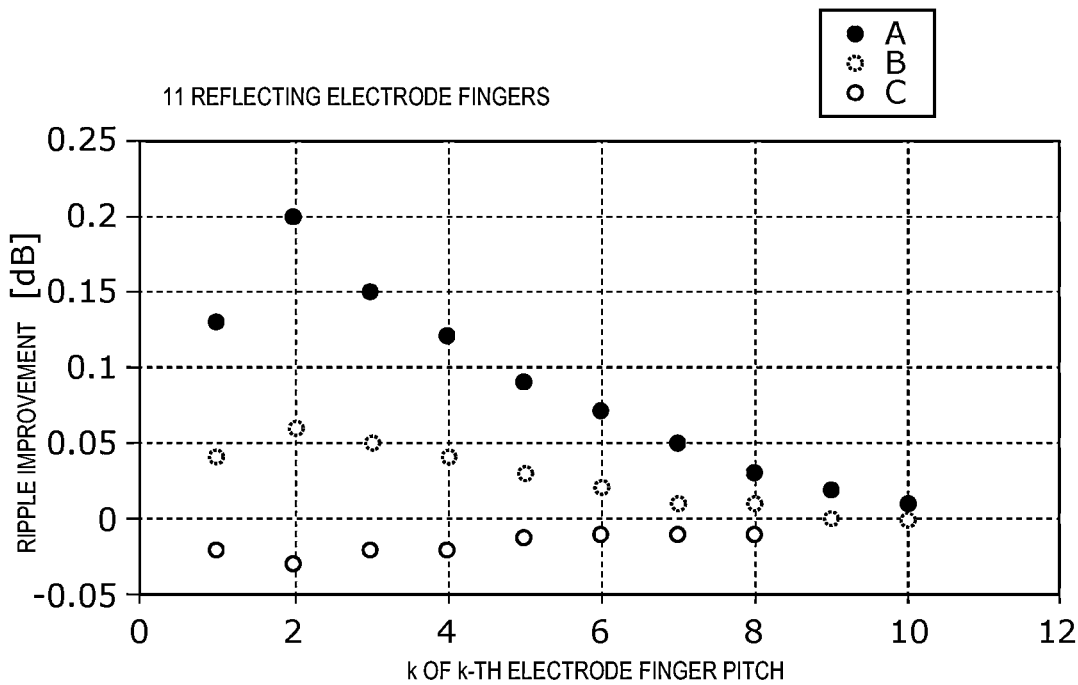
FIG. 13 is a graph showing amounts of improvement of ripples when an electrode-finger pitch of reflectors is changed in Example 5 of a preferred embodiment of the present invention.

FIG. 13 is a graph showing amounts of improvement of ripples A, B, and C when the electrode-finger pitch of the reflectors 12 is changed in Example 5.

As shown in FIG. 13, the ripples A and B can be reduced or prevented by making one electrode-finger pitch of the first electrode-finger pitch $p_1$ to the ninth electrode-finger pitch $p_9$ less than the other electrode-finger pitches. To be more specific, the losses can be reduced or prevented by setting one electrode-finger pitch of the first electrode-finger pitch $p_1$ to the ninth electrode-finger pitch $p_9$ to, for example, about 1.026 times the electrode-finger pitch pi of the IDT electrode 11, and setting the other electrode-finger pitches to, for example, about 1.152 times the electrode-finger pitch pi of the IDT electrode 11. On the other hand, when a value of k of the k-th electrode-finger pitch is 10, the amounts of improvement of the ripples are decreased. Thus, it is preferable to change the electrode-finger pitch up to the ninth electrode-finger pitch $p_9$.

Further, as shown in FIG. 13, when the second electrode-finger pitch $p_2$ is changed, the amounts of improvement of the ripples are largely changed. For example, by making the second electrode-finger pitch $p_2$ less than the other electrode-finger pitches, the ripples A and B can be reduced or prevented, but on the other hand, the loss of the ripple C increases. Thus, for the second electrode-finger pitch $p_2$, it is preferable to maintain the value of the second electrode-finger pitch $p_2$ (=1.047 pi) in Example 1 without changing it.

Example 6

An acoustic wave element of Example 6 of a preferred embodiment of the present invention will be described. In Example 6, an example will be described in which a plurality of electrode-finger pitches including an electrode-finger pitch of the reflecting-electrode finger 12a farthest from the IDT electrode 11 is changed in a case where the total number of reflecting-electrode fingers 12a of the reflectors 12 is, for example, 11.

Figure 14:
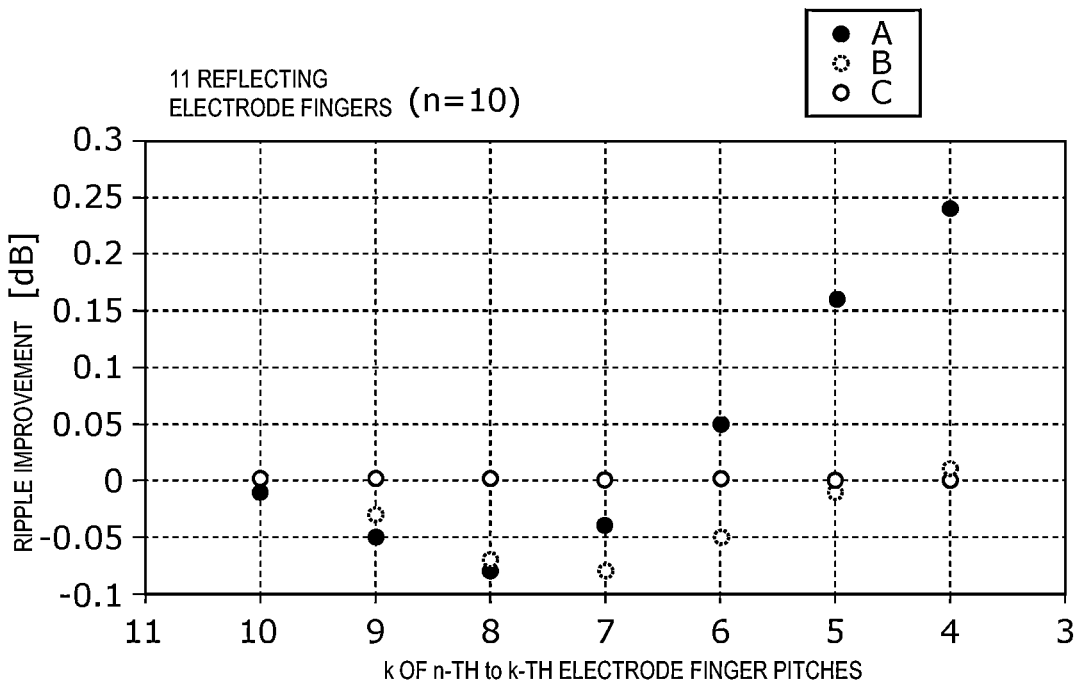
FIG. 14 is a graph showing amounts of improvement of ripples when an electrode-finger pitch of reflectors is changed in Example 6 of a preferred embodiment of the present invention.

FIG. 14 is a graph showing amounts of improvement of ripples A, B, and C when an electrode-finger pitch of the reflectors 12 is changed in Example 6.

As shown in FIG. 14, even when a value of the electrode-finger pitch of the tenth electrode-finger pitch $p_{10}$ is changed, values of the ripples A, B, and C hardly change. To be more specific, even when the value of the tenth electrode-finger pitch $p_{10}$ is set to, for example, about 1.152 times the electrode-finger pitch pi of the IDT electrode 11, and a value of the other electrode-finger pitches is set to, for example, about 1.026 times the electrode-finger pitch pi of the IDT electrode 11, losses cannot be reduced. Thus, even when an electrode-finger pitch of a reflecting-electrode finger 12a located away from the IDT electrode 11 among the reflecting-electrode fingers 12a of the reflectors 12 is changed, the effect of reducing the losses is small.

Example 7

An acoustic wave element of Example 7 of a preferred embodiment of the present invention will be described. In Example 7, an example will be described in which a value of one electrode-finger pitch among a first electrode-finger pitch pi to a k-th electrode-finger pitch $p_k$ is changed in a case where the total number of reflecting-electrode fingers 12a of the reflectors 12 is, for example, about 41.

Figure 15:
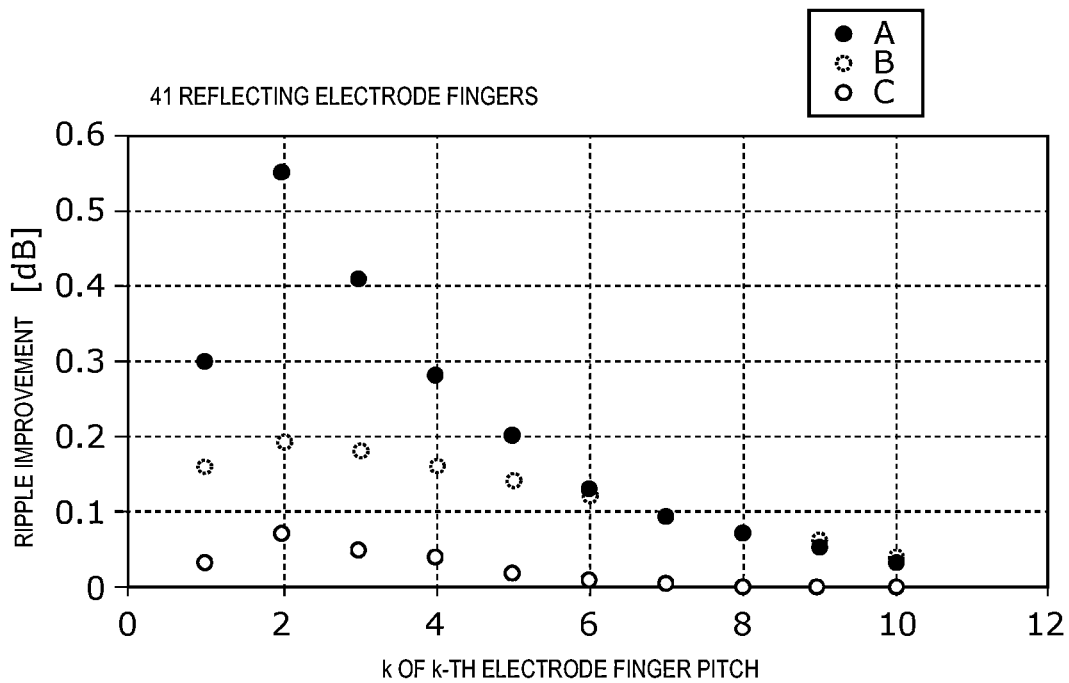
FIG. 15 is a graph showing amounts of improvement of ripples when an electrode-finger pitch of reflectors is changed in Example 7 of a preferred embodiment of the present invention.

FIG. 15 is a graph showing amounts of improvement of ripples A, B, and C when an electrode-finger pitch of the reflectors 12 is changed in Example 7.

As shown in FIG. 15, the ripples A and B can be reduced or prevented by making one electrode-finger pitch of the first electrode-finger pitch pi to the ninth electrode-finger pitch $p_9$ less than the other electrode-finger pitches. To be more specific, the losses can be reduced or prevented by setting one electrode-finger pitch of the first electrode-finger pitch pi to the ninth electrode-finger pitch $p_9$ to, for example, about 1.026 times the electrode-finger pitch pi of the IDT electrode 11, and setting the other electrode-finger pitches to, for example, about 1.152 times the electrode-finger pitch pi of the IDT electrode 11. On the other hand, when a value of k of the k-th electrode-finger pitch is 10, the amounts of improvement of the ripples are decreased. Thus, it is preferable to change the electrode-finger pitch up to the ninth electrode-finger pitch $p_9$.

Further, as shown in FIG. 15, when a second electrode-finger pitch $p_2$ is changed, the amounts of improvement of the ripples are largely changed. For example, by making the second electrode-finger pitch $p_2$ less than the other electrode-finger pitches, the ripples A and B can be reduced or prevented, but on the other hand, the loss of the ripple C increases. Thus, for the second electrode-finger pitch $p_2$, it is preferable to maintain the value of the second electrode-finger pitch $p_2$ (=1.047 pi) in Example 1 without changing it.

Example 8

An acoustic wave element of Example 8 of a preferred embodiment of the present invention will be described. In Example 8, an example will be described in which a plurality of electrode-finger pitches including an electrode-finger pitch of the reflecting-electrode finger 12a farthest from the IDT electrode 11 is changed in a case where the total number of reflecting-electrode fingers 12a of the reflectors 12 is, for example, 41.

Figure 16:
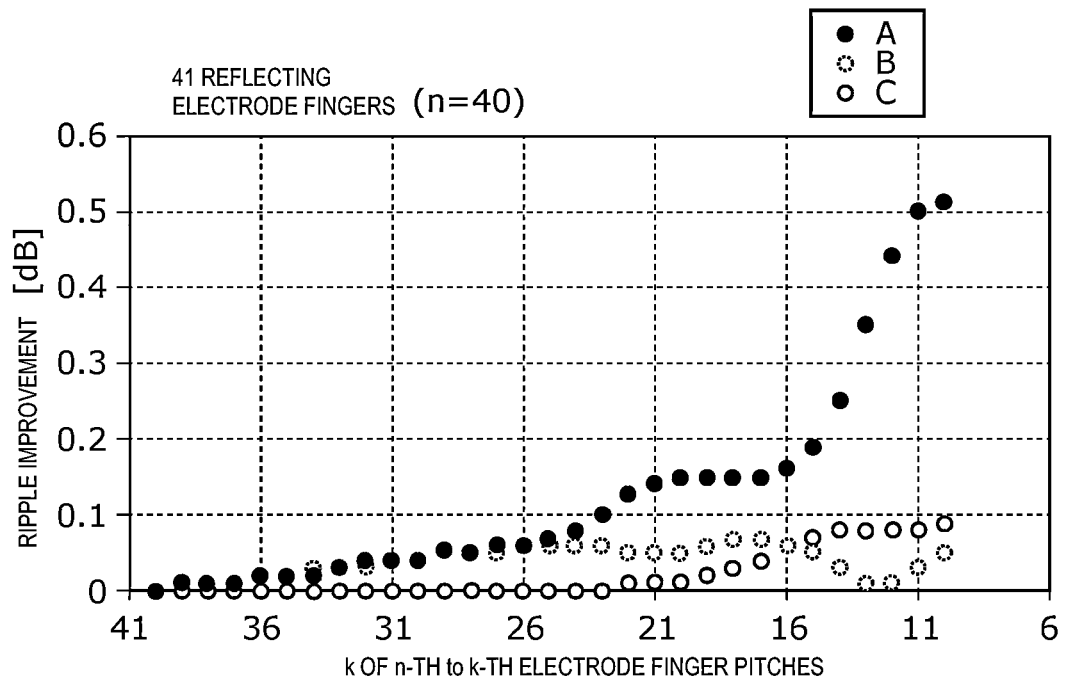
FIG. 16 is a graph showing amounts of improvement of ripples when an electrode-finger pitch of reflectors is changed in Example 8 of a preferred embodiment of the present invention.

FIG. 16 is a graph showing amounts of improvement of ripples A, B, and C when an electrode-finger pitch of the reflectors 12 is changed in Example 8.

As shown in FIG. 16, even when a value of all electrode-finger pitches from a 40th electrode-finger pitch $p_{40}$ to a 31st electrode-finger pitch $p_{31}$ is changed, values of the ripples A, B, and C hardly change. To be more specific, even when the value of all the electrode-finger pitches from the 40th electrode-finger pitch $p_{40}$ to the 31st electrode-finger pitch $p_{31}$ is set to, for example, about 1.152 times the electrode-finger pitch pi of the IDT electrode 11, and a value of the other electrode-finger pitches is set to, for example, about 1.026 times the electrode-finger pitch pi of the IDT electrode 11, losses cannot be reduced. Thus, even when an electrode-finger pitch of a reflecting-electrode finger 12a located away from the IDT electrode 11 among the reflecting-electrode fingers 12a of the reflectors 12 is changed, the effect of reducing the losses is small.

Preferred Embodiment 2

In Preferred embodiment 2 of a preferred embodiment of the present invention, an acoustic wave filter device in which the acoustic wave element 10 according to Preferred embodiment 1 is used will be described. By configuring an acoustic wave filter device by using the acoustic wave element 10 according to Preferred embodiment 1, it is possible to reduce or prevent deterioration in insertion loss in a pass band.

Figure 17:
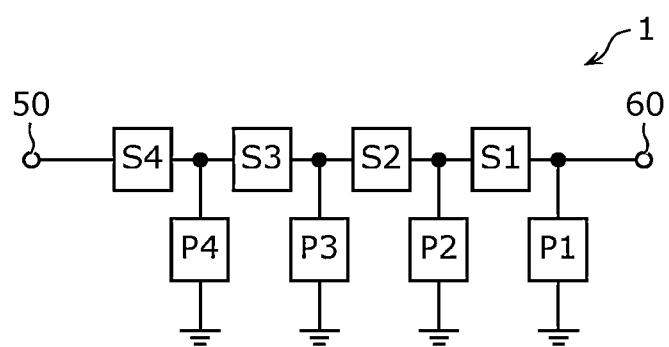
FIG. 17 is a diagram illustrating a circuit configuration of an acoustic wave filter device according to Preferred Embodiment 2 of the present disclosure.

FIG. 17 is a diagram illustrating a circuit configuration of an acoustic wave filter device 1 according to Preferred embodiment 2.

As illustrated in FIG. 17, the acoustic wave filter device 1 includes an input terminal 50 and an output terminal 60, series-arm resonators S1, S2, S3, and S4 connected between the input terminal 50 and the output terminal 60, and parallel-arm resonators P1, P2, P3, and P4 that are each connected to a node on a path connecting the input terminal 50 and the output terminal 60 and to a ground. The acoustic wave element 10 of Preferred embodiment 1 is used for each of the series-arm resonators S1 to S4. In the acoustic wave filter device 1 of the present preferred embodiment, it is possible to reduce or prevent deterioration in insertion loss in a pass band.

Preferred Embodiment 3

Figure 18:
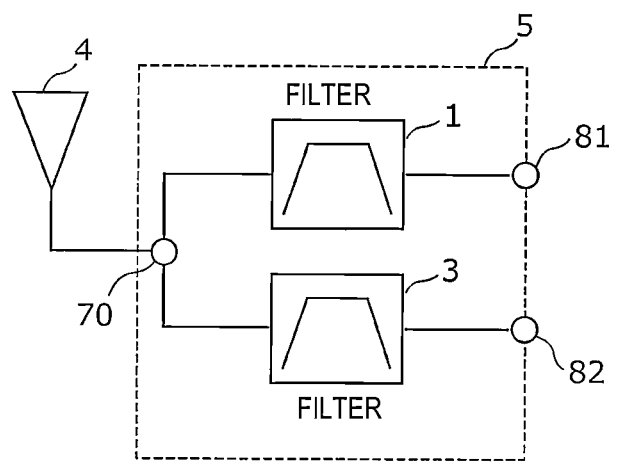
FIG. 18 is a circuit configuration diagram of a multiplexer according to Preferred Embodiment 3 of the present disclosure and a peripheral circuit thereof.

FIG. 18 is a circuit configuration diagram of a multiplexer 5 according to Preferred embodiment 3 of a preferred embodiment of the present invention and a peripheral circuit thereof (antenna 4). The multiplexer 5 illustrated in FIG. 18 includes the acoustic wave filter device 1, a filter 3, a common terminal 70, and input/output terminals 81 and 82.

In the acoustic wave filter device 1, the input terminal 50 of the acoustic wave filter device 1 is connected to the common terminal 70, and the output terminal 60 of the acoustic wave filter device 1 is connected to the input/output terminal 81.

The filter 3 is connected to the common terminal 70 and the input/output terminal 82. The filter 3 is, for example, a ladder acoustic wave filter including parallel-arm resonators and series-arm resonators, but may be an LC filter or the like, and a circuit configuration thereof is not particularly limited.

Here, a pass band of the acoustic wave filter device 1 is located on a frequency side lower than a pass band of the filter 3.

The acoustic wave filter device 1 and the filter 3 need not be directly connected to the common terminal 70 as illustrated in FIG. 18, and for example, may be indirectly connected to the common terminal 70 via an impedance matching circuit, a phase shifter, a circulator, or a switch element capable of selecting two or more filters.

In addition, in the present preferred embodiment, the multiplexer 5 preferably has a circuit configuration in which the two filters are connected to the common terminal 70, but the number of filters connected to the common terminal 70 is not limited to two, and may be three or more. In other words, the multiplexer according to the present invention may include a plurality of filters including the acoustic wave filter device 1, one of an input terminal and an output terminal of each of the filters may be directly or indirectly connected to a common terminal, and at least one of the filters excluding the acoustic wave filter device 1 may have a pass band higher than a frequency in the pass band of the acoustic wave filter device 1.

An acoustic wave element 10 according to a preferred embodiment preferably includes the piezoelectric substrate 100, the IDT electrode 11 provided on the piezoelectric substrate 100 and including the plurality of comb-shaped electrodes 11A and 11B, and the reflectors 12 provided adjacent to the IDT electrode 11 in an acoustic wave propagation direction. The comb-shaped electrodes 11A and 11B include a plurality of comb-shaped electrode fingers 11a and a plurality of comb-shaped electrode fingers 11b, respectively, that are electrode fingers extending in a direction intersecting the acoustic wave propagation direction. The reflectors 12 include a plurality of reflecting-electrode fingers 12a that are electrode fingers extending in a direction intersecting the acoustic wave propagation direction. When, in the plurality of electrode fingers included in the IDT electrode 11 and the reflectors 12, a center-to-center distance between the electrode fingers adjacent to each other in the acoustic wave propagation direction is defined as an electrode-finger pitch, an electrode-finger pitch of the plurality of reflecting-electrode fingers 12a is greater than the electrode-finger pitch pi of a plurality of comb-shaped electrode fingers, and a center-to-center distance in the acoustic wave propagation direction between the reflecting-electrode finger 12a closest to the IDT electrode 11, of the plurality of reflecting-electrode fingers 12a, and a comb-shaped electrode finger closest to the reflector 12, of the plurality of comb-shaped electrode fingers 11a and 11b, is equal to or less than about 0.9 times an electrode-finger pitch of the plurality of reflecting-electrode fingers 12a. When the reflecting-electrode finger 12a counted from the reflecting-electrode finger 12a closest to the IDT electrode 11 in a direction away from the IDT electrode 11 are designated as a k-th reflecting-electrode finger in order (where k is an integer equal to or greater than 1), the reflecting-electrode finger 12a farthest from the IDT electrode 11 is defined as an (n+1)-th reflecting-electrode finger (where n is an integer greater than k), an electrode finger pitch between the k-th reflecting-electrode finger and a (k+1)-th reflecting-electrode finger is defined as a k-th electrode-finger pitch $p_k$, a value of electrode-finger pitches from a first electrode-finger pitch $p_1$ to the k-th electrode-finger pitch $p_k$ is less than a value of electrode-finger pitches from a (k+1)-th electrode-finger pitch $p_{k+1}$ to an n-th electrode-finger pitch $p_n$.

As described above, in the reflectors 12, by making the value of the electrode-finger pitches from the first electrode-finger pitch $p_1$ to the k-th electrode-finger pitch $p_k$ less than the value of the electrode-finger pitches from the (k+1)-th electrode-finger pitch $p_{k+1}$ to the n-th electrode-finger pitch $p_n$, it is possible to reduce or prevent a ripple occurring on a frequency side lower than a resonant frequency of the acoustic wave elements 10.

In addition, a value of the electrode-finger pitches from the first electrode-finger pitch $p_1$ to the k-th electrode-finger pitch $p_k$ excluding a second electrode-finger pitch $p_2$ may be less than the value of the electrode-finger pitches from the (k+1)-th electrode-finger pitch $p_{k+1}$ to the n-th electrode-finger pitch $p_n$.

According to the above-described configuration, for example, the occurrence of the ripples A and B shown in Example 1 can be reduced or prevented. Accordingly, it is possible to reduce or prevent a ripple that occurs on a frequency side lower than the resonant frequency of the acoustic wave element 10.

In addition, a value of the second electrode-finger pitch $p_2$ may be greater than the value of the electrode-finger pitches from the first electrode-finger pitch $p_1$ to the k-th electrode-finger pitch $p_k$ excluding the second electrode-finger pitch $p_2$, and may be less than the value of the electrode-finger pitches from the (k+1)-th electrode-finger pitch $p_{k+1}$ to the n-th electrode-finger pitch $p_n$.

According to the above-described configuration, for example, as shown in Example 1 in FIG. 12, an insertion loss can be further reduced or prevented compared to Example 4. Accordingly, it is possible to reduce or prevent a ripple that occurs on a frequency side lower than the resonant frequency of the acoustic wave element 10.

Further, the number of reflecting-electrode fingers 12a may be equal to or greater than 11, and k of the k-th electrode-finger pitch may be 9.

According to the above-described configuration, for example, the occurrence of the ripples A and B shown in Examples 1, 5, and 7 can be reduced or prevented. Accordingly, it is possible to reduce or prevent a ripple that occurs on a frequency side lower than the resonant frequency of the acoustic wave element 10.

An acoustic wave filter device 1 according to a preferred embodiment includes the above-described acoustic wave element 10.

Accordingly, it is possible to provide the acoustic wave filter device 1 in which a ripple occurring on a frequency side lower than the resonant frequency of the acoustic wave element 10 can be reduced or prevented.

Additionally, the acoustic wave filter device 1 may further include the input terminal 50 and the output terminal 60 and the parallel-arm resonators P1 to P4 that are each connected to a node on a path connecting the input terminal 50 and the output terminal 60 and to a ground, and the acoustic wave element 10 may be any of the series-arm resonators S1 to S4 connected between the input terminal 50 and the output terminal 60.

According to the above-described configuration, the acoustic wave filter device 1 defines a ladder acoustic wave filter including the series-arm resonators S1 to S4 and the parallel-arm resonators P1 to P4, and the above-described acoustic wave element 10 is applied to the series-arm resonators S1 to S4. Thus, it is possible to reduce or prevent an increase in insertion loss on a frequency side lower than a resonant frequency of the series-arm resonators S1 to S4 constituting the pass band of the acoustic wave filter device 1.

A multiplexer 5 according to a preferred embodiment may include a plurality of filters including the above-described acoustic wave filter device 1, one of an input terminal and an output terminal of each of the filters may be directly or indirectly connected to the common terminal 70, and at least one of the filters excluding the acoustic wave filter device 1 may have a pass band higher than a frequency in the pass band of the acoustic wave filter device 1.

In the above-described acoustic wave filter device 1, it is possible to increase attenuation in an attenuation band on a frequency side higher than the pass band. Accordingly, it is possible to provide the multiplexer 5 in which an insertion loss in a pass band of a filter having the pass band on the frequency side higher than the pass band of the acoustic wave filter device 1 can be reduced or prevented.

Other Preferred Embodiments

Although the acoustic wave element, the acoustic wave filter device, and the multiplexer according to the preferred embodiments of the present invention have been described with reference to the preferred embodiments and the examples, the acoustic wave element, the acoustic wave filter device, and the multiplexer of the present invention are not limited to the above-described preferred embodiments and the examples. The present invention also includes other preferred embodiments achieved by combining any components in the above-described preferred embodiments and examples, examples obtained by applying various modifications conceived by those skilled in the art to the above-described preferred embodiments without departing from the scope of the present invention, and various devices incorporating the acoustic wave element, the acoustic wave filter device, and the multiplexer of the present invention.

For example, the acoustic wave filter device 1 according to a preferred embodiment of the present invention may further include circuit elements such as an inductor and a capacitor.

Additionally, an acoustic wave element according to a preferred embodiment of the present invention need not be the surface acoustic wave resonator as in Preferred embodiment 1, and may be an acoustic wave resonator in which a boundary acoustic wave is utilized.

Preferred embodiments of the present invention are widely usable for communication devices such as, for example mobile phones, as low-loss and small-sized acoustic wave element, acoustic wave filter device, and multiplexer applicable to multi-band and multi-mode frequency standards.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave element comprising:
a piezoelectric substrate;
an interdigital transducer (IDT) electrode on the piezoelectric substrate and including a plurality of comb-shaped electrodes; and
a reflector adjacent to the IDT electrode in an acoustic wave propagation direction; wherein
the comb-shaped electrodes include a plurality of comb-shaped electrode fingers extending in a direction intersecting the acoustic wave propagation direction;
the reflector includes a plurality of reflecting-electrode fingers extending in a direction intersecting the acoustic wave propagation direction;
when, in the a plurality of electrode fingers included in the IDT electrode and the reflector, a center-to-center distance between ones of the electrode fingers adjacent to each other in the acoustic wave propagation direction is defined as an electrode-finger pitch:
an electrode-finger pitch of the plurality of reflecting-electrode fingers is greater than an electrode-finger pitch of the plurality of comb-shaped electrode fingers; and
a center-to-center distance in the acoustic wave propagation direction between a reflecting-electrode finger closest to the IDT electrode of the plurality of reflecting-electrode fingers and a comb-shaped electrode finger closest to the reflector of the plurality of comb-shaped electrode fingers is equal to or less than about 0.9 times the electrode-finger pitch of the plurality of reflecting-electrode fingers;
when a reflecting-electrode finger counted from one of the reflecting-electrode fingers which is closest to the IDT electrode in a direction away from the IDT electrode is designated as a k-th reflecting-electrode finger in order, where k is an integer equal to or greater than 1;
one of the reflecting-electrode fingers farthest from the IDT electrode is defined as an (n+1)-th reflecting-electrode finger, where n is an integer greater than k;
an electrode-finger pitch between the k-th reflecting-electrode finger and a (k+1)-th reflecting-electrode finger is defined as a k-th electrode-finger pitch; and
a value of electrode-finger pitches from a first electrode-finger pitch to the k-th electrode-finger pitch is less than a value of electrode-finger pitches from the (k+1)-th electrode-finger pitch to an n-th electrode-finger pitch.

2. The acoustic wave element according to claim 1, wherein
a value of the electrode-finger pitches from the first electrode-finger pitch to the k-th electrode-finger pitch excluding a second electrode-finger pitch is less than the value of the electrode-finger pitches from the (k+1)-th electrode-finger pitch to the n-th electrode-finger pitch.

3. The acoustic wave element according to claim 2, wherein
a value of the second electrode-finger pitch is greater than the value of the electrode-finger pitches from the first electrode-finger pitch to the k-th electrode-finger pitch excluding the second electrode-finger pitch, and is less than the value of the electrode-finger pitches from the (k+1)-th electrode-finger pitch to the n-th electrode-finger pitch.

4. The acoustic wave element according to claim 1, wherein
a number of reflecting-electrode fingers is equal to or greater than 11, and
k of the k-th electrode-finger pitch is 9.

5. An acoustic wave filter device comprising:
the acoustic wave element according to claim 1.

6. The acoustic wave filter device according to claim 5, further comprising:
an input terminal and an output terminal; and
a parallel-arm resonator connected to a node on a path connecting the input terminal and the output terminal and to a ground; wherein
the acoustic wave element is a series-arm resonator connected between the input terminal and the output terminal.

7. A multiplexer comprising:
a plurality of filters including the acoustic wave filter device according to claim 6; wherein
one of an input terminal and an output terminal of each of the plurality of filters is directly or indirectly connected to a common terminal; and
at least one of the plurality of filters excluding the acoustic wave filter device has a pass band higher than a frequency in a pass band of the acoustic wave filter device.

8. The acoustic wave element according to claim 1, wherein
the IDT electrode and the reflector are both defined by a multilayer structure which includes an adhesion layer and a main electrode layer.

9. The acoustic wave element according to claim 8, further comprising:
a protective film which covers the IDT electrode and the reflector.

10. The acoustic wave element according to claim 1, wherein
the comb-shaped electrodes includes a pair of comb-shaped electrodes which oppose one another.

11. The acoustic wave element according to claim 1, further comprising:
an additional reflector including additional reflecting-electrode fingers; wherein
the reflector and the additional reflector are respectively located on opposing ones of two outer sides of the IDT electrode.

12. The acoustic wave element according to claim 11, wherein
the reflector and the additional reflector are mirror-symmetrical with respect to the acoustic wave propagation direction.

* * * * *